United States Patent
Schreiber et al.

(10) Patent No.: US 8,381,163 B2
(45) Date of Patent: Feb. 19, 2013

(54) POWER-GATED RETENTION FLOPS

(75) Inventors: Jeremy P. Schreiber, Austin, TX (US); Aaron Grenat, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 12/951,500

(22) Filed: Nov. 22, 2010

(65) Prior Publication Data

US 2012/0131526 A1    May 24, 2012

(51) Int. Cl.
G06F 9/455  (2006.01)
G06F 17/50  (2006.01)

(52) U.S. Cl. ........ 716/133; 716/101; 716/102; 716/120; 716/127

(58) Field of Classification Search .......... 716/101, 716/102, 120, 127, 132, 133
See application file for complete search history.

(56) References Cited

U.S. PATENT DOCUMENTS

| | | | |
|---|---|---|---|
| 7,080,341 B2 | 7/2006 | Eisenstadt | |
| 7,948,263 B2 | 5/2011 | Kim | |
| 7,982,514 B2 | 7/2011 | Biyani | |
| 2002/0186040 A1* | 12/2002 | Ooishi | 326/1 |
| 2005/0251763 A1* | 11/2005 | Cheung et al. | 716/3 |
| 2007/0198962 A1* | 8/2007 | Matsumoto et al. | 716/13 |
| 2007/0300108 A1* | 12/2007 | Saint-Laurent et al. | 714/726 |
| 2008/0164912 A1* | 7/2008 | Cheng et al. | 326/82 |
| 2010/0162058 A1* | 6/2010 | Brown et al. | 714/726 |

* cited by examiner

*Primary Examiner* — Thuan Do
*Assistant Examiner* — Brian Ngo
(74) *Attorney, Agent, or Firm* — Meyertons, Hood, Kivlin, Kowert & Goetzel, P.C.; Erik A. Heter

(57) ABSTRACT

A power-gated retention flop circuit is disclosed. In one embodiment, a retention flop includes a first latch coupled to a first global voltage node and a virtual voltage node and configured to receive a data input signal, and a second latch coupled to receive the data input signal from the first latch, wherein the second latch is coupled to the first global voltage node and a second global voltage node. The second latch is configured to provide a data output signal based on the data input signal. A power-gating circuit is coupled between the virtual voltage node and the second global voltage node, wherein the power-gating circuit is configured to, when active, couple the virtual voltage node to the second global voltage node. Thus, the first latch may be powered down while the second latch remains powered on.

30 Claims, 5 Drawing Sheets

POWER-GATED RETENTION FLOPS

BACKGROUND

1. Field of the Invention

This invention relates to electronic circuits, and more particularly, to storage circuits.

2. Description of the Related Art

During the design of a computing device (e.g., traditional computer, notebook, server, handheld or other mobile device, etc.) or other processor-based system, many design factors must be considered. A successful design may require several tradeoffs between power consumption, performance, thermal output, and so forth. For example, the design of a computer system with an emphasis on high performance may allow for greater power consumption and thermal output. Conversely, the design of a portable computing device that is sometimes powered by a battery may emphasize reducing power consumption at the expense of some performance. These same factors may be considered when designing the individual IC's to be used in the computer system.

One commonly used method of controlling power consumption is the use of power-gating. In a power-gated circuit, one of the voltage planes (e.g., supply voltage or ground) is a virtual voltage plane that is coupled to a corresponding actual voltage plane through a power-gating device (e.g., a transistor). When the power-gating device is active, power may be provided to or removed from by respectively activating or deactivating the power-gated circuit.

Power-gating may be used in many types of processor-based systems. Circuits may be divided into various power domains or functional units, and these may be powered on and/or off independent of other power domains/functional units. In some cases, where information is stored in circuits of a functional unit, the information may be written to another storage device prior to powering down the functional unit.

SUMMARY OF EMBODIMENTS OF THE DISCLOSURE

A power-gated retention flop circuit is disclosed. In one embodiment, a retention flop includes a first latch circuit coupled to a first global voltage node and a virtual voltage node and configured to receive a data input signal. The retention flop further includes a second latch circuit coupled to receive the data input signal from the first latch circuit, wherein the second latch circuit is coupled to the first global voltage node and a second global voltage node, and wherein the second latch circuit is configured to provide a data output signal based on a state of the data input signal. A power-gating circuit may be coupled between the virtual voltage node and the second global voltage node, wherein the power-gating circuit is configured to, when active, couple the virtual voltage node to the second global voltage node.

In one embodiment, a method includes providing a data signal to a data input of a first latch of a storage circuit, the storage circuit including the first latch and a second latch. The method further includes the second latch receiving the data signal from the first latch and providing the data signal on a data output. Subsequent to receiving the data, the first latch may be power down, while the power to the second latch may be retained. The state of the data signal provided on the data output of the second latch may be retained subsequent to powering down the first latch.

BRIEF DESCRIPTION OF THE DRAWINGS

Other aspects of the invention will become apparent upon reading the following detailed description and upon reference to the accompanying drawings in which.

Figure 1:
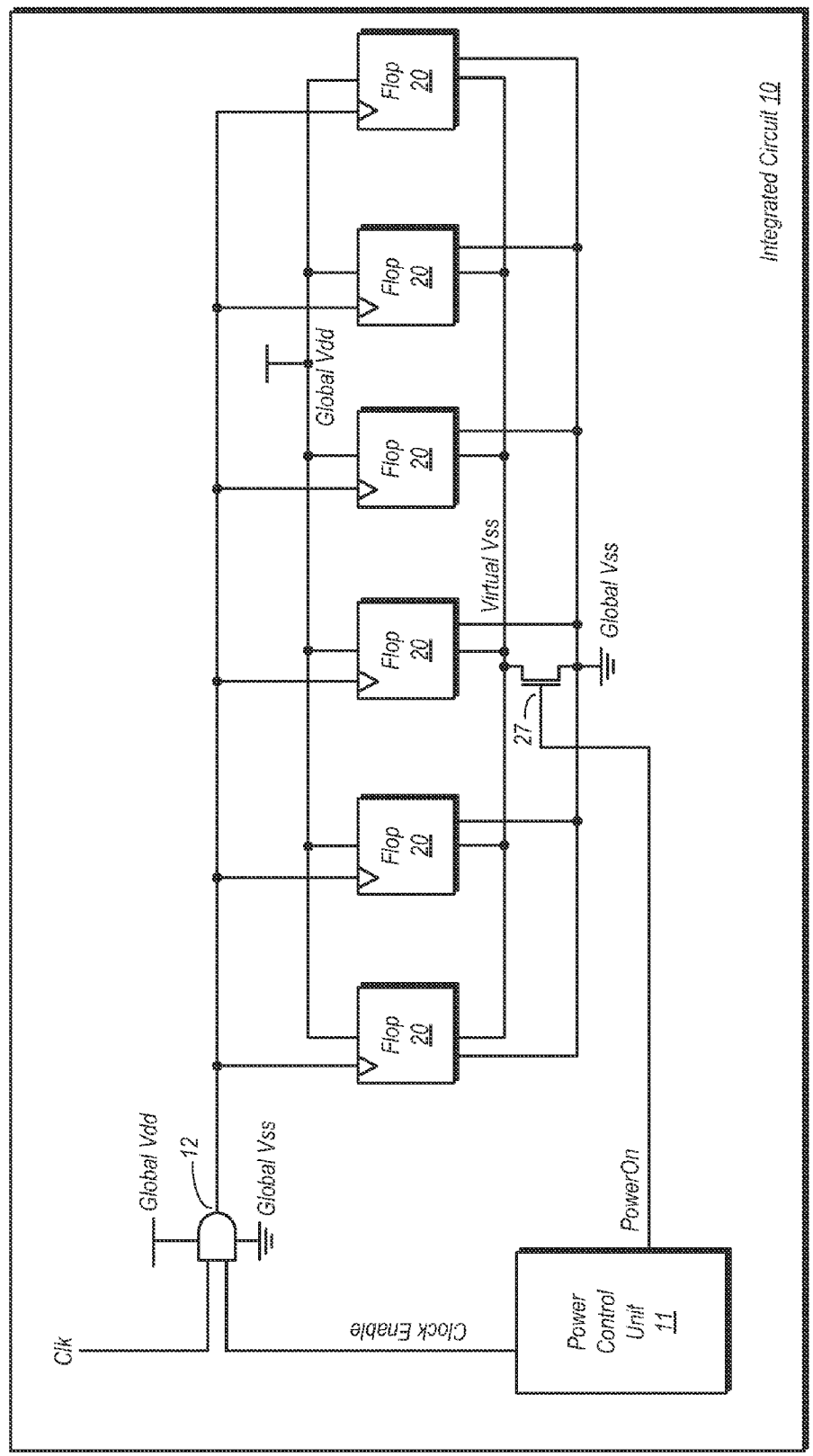
FIG. 1 is a block diagram of one embodiment of an integrated circuit (IC)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF EMBODIMENTS

Overview

Various embodiments of a retention flop circuit are disclosed herein, wherein portions of these retention flop circuits may be power-gated, while the other portions are not power-gated. For example, in a retention flop circuit having a first latch configured to act as a master latch, and a second latch configured to act as a slave latch, the first latch may be power-gated. Thus, the first latch may be powered down (e.g., when operating in a sleep mode), while the second latch may remain powered on. This may in turn realize power savings from powering down the first latch, while allowing for the retention of the data by the second latch, which remains powered on. Accordingly, circuitry utilizing these retention flop circuits may recover from a sleep mode without any delay incurred by having to reload data. Furthermore, entry into a sleep mode may be accomplished without incurring a delay from having to store the data from the retention flops to another storage medium.

In one embodiment, the first latch of a retention flop may be coupled to a first global voltage node (e.g., a global voltage supply node) and a virtual voltage node (e.g., a virtual voltage return node). The second latch may be coupled to the first global voltage node and a second global voltage node (e.g., a global voltage return node). A power-gating circuit may be coupled between the second global voltage node and the virtual voltage node. The power-gating circuit may be implemented as one or more transistors coupled between the second global voltage node and the virtual voltage node. Power may be provided to the first latch when the transistor implementing the power-gating circuit is active, and may be removed by deactivating the transistor (thereby decoupling the second global voltage node from the virtual voltage node). Power may continue to be provided to the second latch even when the first latch is powered down. As used herein, a power-gating circuit may be defined as a circuit coupled between a global voltage node (to be defined below) and a virtual voltage node (also defined below) for the purposes of selectively applying power to and removing power from a power domain associated with the virtual voltage node. A power-gating transistor as defined herein may be a transistor that, when activated, electrically couples the virtual voltage node to a global voltage node in order to apply power to the power-domain associated with the global voltage node. When inactive, a power-gating transistor may inhibit power from being provided to the voltage domain associated with the global voltage node to which it is coupled.

As used herein, a global voltage node refers a voltage node that serves as voltage node for circuitry in one or more power domains that operate on the same supply voltage. For example, a global voltage supply node may be defined as a voltage node upon which a supply voltage is provided to the circuitry of one or more power domains. Similarly, a global voltage return node (e.g., a global ground node) may be defined as a voltage node that provides a return path for circuitry of one or more power domains. It is noted that there is no theoretical limit to the number power domains to which a global voltage node may be coupled.

A virtual voltage node refers to a voltage node that is exclusive to a single power domain. A virtual voltage node further refers to a voltage node that may be selectively coupled to or decoupled from a corresponding global voltage node. For example, when powering up power-gated circuitry in a particular power domain, a virtual voltage supply node may be coupled to a corresponding global voltage supply node via one or more power-gating transistors or other switching devices. When power is to be removed from that power domain (e.g., when entering a sleep mode), the virtual voltage supply node may be decoupled from its corresponding global voltage supply node (e.g., by deactivating one or more power-gating transistors coupled therebetween). Accordingly, the supply of power to a power domain that includes a virtual voltage node as defined herein is thus dependent on coupling (e.g., through one or more transistors) the virtual voltage node to its corresponding global voltage node. Furthermore, whereas a virtual voltage node is associated with a corresponding global voltage node (e.g., virtual voltage supply node associated with a global voltage supply node), the reverse is not necessarily true. That is, a global voltage node need not be associated with any virtual voltage node. For example, in a system that implements a virtual voltage supply node for each of one or more power domains, a global ground node may be coupled to all power domains, even though no virtual ground node is implemented in such an embodiment.

As previously noted, the use of power-gating for a data master latch of the retention flop while leaving the data slave latch powered on may enable the retention of data while providing power savings when operating in a sleep mode. Additional power savings may be realized in a sleep mode for the retention flop circuits by selectively providing or inhibiting a clock signal. Both the first and second latches of a retention flop circuit may be coupled to receive a clock signal. When entering a sleep mode, the clock inputs of the first and second latches may be driven to a predetermined state (e.g., to a logic low voltage) such that the clock is inhibited but is not floating.

Various embodiments of a retention flop and an integrated circuit in which they may be utilized will now be discussed in further detail.

Integrated Circuit:

Turning now to FIG. 1, a block diagram of one embodiment of an integrated circuit (IC) is illustrated. It is noted that FIG. 1 is provided for illustrative purposes. Other circuitry that is not explicitly shown in FIG. 1 may nevertheless be included in IC 10. Furthermore, although circuitry of a single power domain is shown in FIG. 1, embodiments of IC 10 having multiple power domains are possible and contemplated.

In the embodiment shown, IC 10 includes a number of storage circuits, retention flops 20. Each retention flop 20 in the embodiment shown may be used to store data provided by other circuits, and may provide this data to other circuits as well. For example, retention flops may be provided between two different functional units (e.g., a bus interface unit and a memory controller), and may store data transmitted between these two units. Numerous other uses of retention flops 20 are possible and contemplated, and thus the disclosure is not intended to be limiting to those examples explicitly provided herein.

Each retention flop 20 is coupled to receive a supply voltage from a global voltage supply node, global Vdd. A portion of each retention flop 20 may be directly coupled to a global voltage return node, global Vss. Another portion of each retention flop 20 may be directly coupled to a virtual voltage node, virtual Vss. At least one power-gating transistor 27 is coupled between virtual Vss and global Vss in order to implement a power-gating circuit. Additional instances of power-gating transistor 27 may be included in various embodiments of IC 10 for implementing the power-gating circuit, although only a single instance is shown here for the sake of simplicity. When power-gating transistor 27 is active, virtual Vss may effectively be coupled to global Vss. When power-gating transistor 27 is inactive, virtual Vss may be decoupled from global Vss. Accordingly, those portions of each retention flop 20 that are coupled to virtual Vss may be powered on by activating power-gating transistor 27, and powered off by deactivating power-gating transistor 27. The portions of each retention flop 20 that are directly coupled to both global Vdd and global Vss may remain powered on regardless of the state of the portions of retention flop 20 that are coupled to virtual Vss. Arrangements of such retention flops will be discussed in further detail below with reference to FIGS. 2 and 3.

Power-gating transistor 27 may be controlled by power control unit 11. In the embodiment shown, power control unit 11 may assert a signal, 'PowerOn', in order to provide power to the power-gated portions of each retention flop 20. Responsive to assertion of this signal, transistor 27 may be activated, thereby coupling virtual Vss to global Vss. If retention flops 20 are to be placed in a sleep mode, power control unit 11 may deassert the PowerOn signal, thereby decoupling virtual Vss from global Vss.

As noted above, IC 10 may include multiple power domains. Accordingly, power control unit 11 may be coupled to additional instances of a power-gating transistor 27 in other power domains (not shown). Power control of the other power domains may be accomplished in a manner similar to that described above.

In the embodiment shown, each retention flop 20 is coupled to receive a clock signal on at least one clock input. Power control unit 11 may enable the clock by asserting the clock enable signal, which may be provided to clock-gating circuit 12. In this embodiment, clock-gating circuit 12 is implemented as an AND gate, although implementations using other types of circuitry are possible and contemplated. In general, any circuitry suitable for selectively providing or inhibiting a clock signal may be used to implement clock-gating circuitry 12. The AND gate used to implement clock-gating circuitry 12 in this embodiment is coupled to receive the clock enable signal on a first input and the clock signal on a second input. Clock-gating circuitry 12 is not power-gated in this embodiment, and thus is coupled directly to global Vdd and global Vss. When the clock enable signal is asserted, the output of the AND gate used to implement clock-gating circuitry 12 may follow the clock signal. If the clock enable signal is deasserted, the AND gate used to implement clock-gating circuitry 12 may provide a logic low to the clock inputs of each of retention flops 20. This may in turn prevent the node coupled to these inputs from floating when the clock is inhibited.

Thus, in accordance with the above, power control unit 11 may cause retention flops 20 to enter a sleep mode by deasserting the PowerOn and clock enable signal. This may reduce power consumption by powering down certain portions of each retention flop 20 and also preventing these elements from consuming power associated with receiving the clock signal. As noted above however, certain portions of each retention flop 20 may remain powered when in the sleep mode. The portions that remain powered on may thus retain data previously stored into retention flops 20. Exemplary embodiments of such retention flops will now be discussed with reference to FIGS. 2 and 3.

Retention Flop Embodiments

Figure 2:
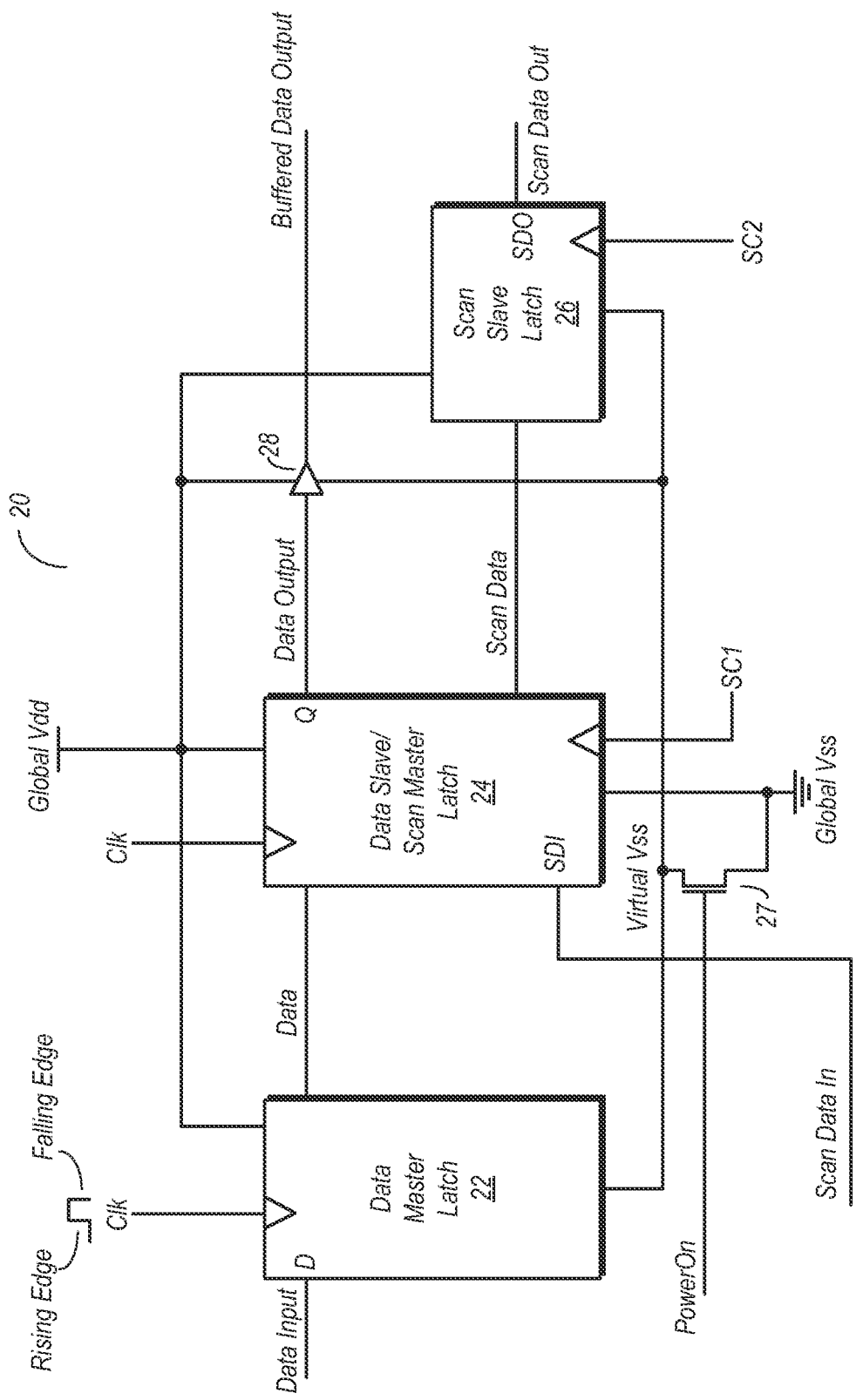
FIG. 2 is a block diagram of one embodiment of a retention flop circuit.

FIG. 2 is a block diagram of one embodiment of a retention flop circuit. In the embodiment shown, retention flop 20 is a storage circuit (i.e. a flip-flop) that includes a first latch 22, a second latch 24, and a third latch 26. Embodiments having only first latch 22 and second latch 24 are possible and contemplated.

First latch 22 may operate as a data master latch of a D-type flip-flop in this particular embodiment. Second latch 24 may thus act as a data slave latch in this particular embodiment. A bit of data may be received as a signal on the data input D of first latch 22, responsive to a rising edge of a clock signal. The clock signal may also be received by second latch 24. Responsive to a falling edge of the clock signal, second latch 24 may convey the data bit to the Q output. The data bit may be provided on the Q output at the falling edge of the clock signal at a logic state that is dependent on the state of the data bit when received on the D input at the rising edge of the clock signal. For example, if a logic 1 is present on the D input at the rising edge of the clock signal, a logic 1 may be provided on the Q output at the next falling edge of the clock signal.

In the embodiment shown, both first latch 22 and second latch 24 are coupled to receive power from a global voltage supply node, global Vdd. Second latch 24 is also directly coupled to a global voltage return node, global Vss. However, first latch 22 is not directly coupled to global Vss, but rather is coupled to virtual Vss. Power may be applied to first latch 22 when power-gating transistor 27 is active, thereby coupling virtual Vss to global Vss. First latch 22 may be powered down by deactivating power-gating transistor 27, thus decoupling virtual Vss from global Vss. Therefore, first latch 22 may be powered down when retention flop 20 is placed in a sleep mode. However, since second latch 24 is directly coupled to both global Vdd and global Vss, second latch may thus remain powered up during sleep mode operations. Moreover, since second latch 24 remains powered on during sleep mode operations, the most recent data provided to its Q output remains valid. This may enable circuitry utilizing retention flop 20 to retain its state when in a sleep mode, while eliminating the need to store data in another location (to enter a sleep mode) and/or to reload data from the other location (to exit the sleep mode). It is noted that power-gating transistor 27 is not explicitly part of retention flop 20, and may in fact be coupled to provide power gating for multiple instances thereof.

Retention flop 20 may be configured to enable scan testing. In the embodiment shown, retention flop 20 includes a third latch 26. Third latch 26 is coupled to receive power directly from the global Vdd node, and is further coupled to virtual Vss. Accordingly, third latch 26 may be power-gated in the same manner as first latch 26 (i.e. placed into a sleep mode by deactivation of power-gating transistor 27). Alternate embodiments are also possible and contemplated wherein third latch 26 is powered down when scan testing is not enabled.

Second latch 24, in addition to being configured to act as a data slave latch may also be configured to act as a scan master latch. In the embodiment shown, third latch 26 is configured to operate as a scan slave latch. In addition to being coupled to receive a data bit from first latch 22, second latch 24 may also include a scan data input (SDI) through which test stimulus data may be shifted into retention flop 20. Test stimulus data shifted into second latch 24 may be conveyed either to the Q output or to third latch 26 via the scan data signal path shown. Similarly, data received from first latch 22 via the data signal path shown may be provided to either the Q output or to the third latch via the scan data path. Accordingly, second latch 24 may enable retention flop 20 to launch test stimulus data to other circuits (via the Q output) or to capture test result data (via the D input and the data signal path).

Scan shifting operations through retention flop 20 may occur in accordance with first and second scan clock signals, SC1 and SC2, respectively. A bit of scan data may be loaded into second latch 24 responsive to the first scan clock signal. When loaded into second latch 24, the bit of scan data may be conveyed to the scan data signal patch between second latch 24 and third latch 26. Responsive to the second clock signal, third latch 26 may load the scan data from the scan data path, providing it on its scan data output. A number of retention flops 20 may be coupled together serially to form a scan chain, with the scan data input of a given retention flop 20 being coupled to a scan data output of a previous retention flop 20. A first retention flop 20 in the serially-coupled scan chain may have its scan data input coupled to a scan data input pin of the IC in which it is implemented, while last retention flop 20 in the serially-coupled scan chain may have its scan data output coupled to a scan data output pin of the IC.

It is noted that scan enables portions retention flop 20 in the embodiment shown correspond to level sensitive scan design (LSSD) scan flops. However, embodiments that correspond to the multiplexer-D ('Mux-D') scan design are also possible and contemplated. It is further noted that that embodiments of retention flop 20 that are not scan testing enabled (and thus do not include third latch 26 as well as circuitry enabling second latch 24 to operate as a scan master) are possible and contemplated.

In the embodiment shown, retention flop 20 includes an optional buffer 28. Buffer 28 may be provided to increase the fan out or otherwise increase the drive strength of the data output signal provided on the Q output of second latch 24. Buffer 28 in this embodiment is coupled between global Vdd and virtual Vss. Accordingly, buffer 28 may also be powered up or down by activation or deactivation, respectively, of power-gating transistor 27. However, as noted, buffer 28 may be optional, and thus embodiments of retention flop 20 that do not include this circuitry are possible and contemplated.

Figure 3:
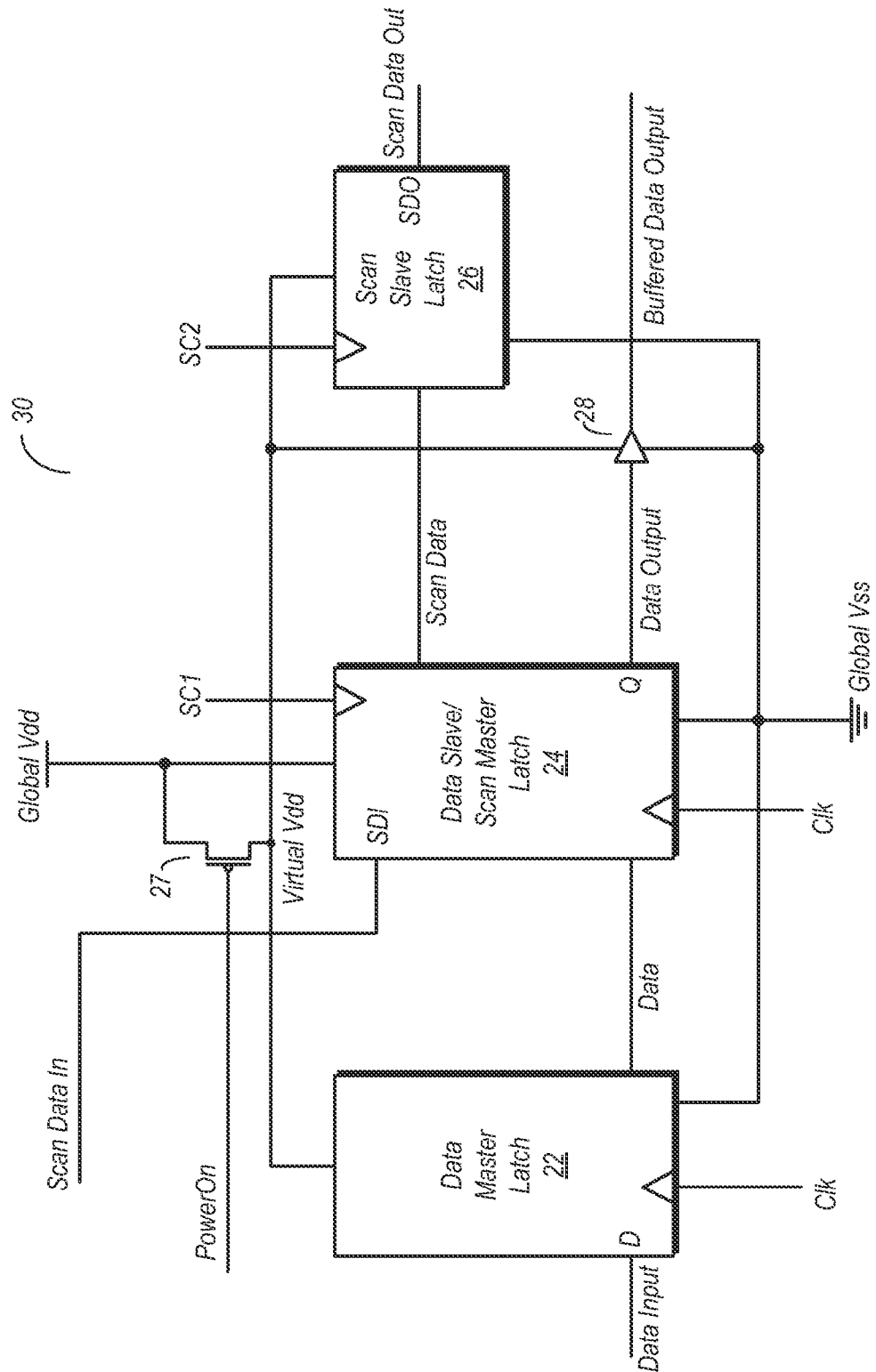
FIG. 3 is a block diagram of another embodiment of a retention flop circuit.

FIG. 3 is a block diagram of another embodiment of a retention flop circuit. In the embodiment shown, retention flop 30 includes elements that may be equivalent to those of retention flop 20 shown in FIG. 2 (e.g., first latch 22, second latch 24, etc.). More particularly, the functioning of each of these elements may be equivalent to their counterparts in FIG. 2.

In this particular embodiment, first latch 22, second latch 24, third latch 26, and buffer 28 are each directly coupled to the global Vss node. Second latch 24 is further coupled directly to the global Vdd node. First latch 22, third latch 25, and buffer 28 are coupled to virtual Vdd. Thus, first latch 22, third latch 26, and buffer 28 may be powered on by activating power-gating transistor 27, and powered off by deactivating power-gating transistor 27. Second latch 24 may remain powered on independent of the status (powered on or off) of first latch 22, third latch 26, and buffer 28. Accordingly, second latch 24 may retain the most recent data state on its Q output even when retention flop 30 is in a sleep mode.

As with the embodiment shown in FIG. 2, buffer 28 and third latch 26 are optional in retention flop 30, and thus similar embodiments without these elements are possible and contemplated. Thus, embodiments of retention flop 30 that are possible not scan enabled and/or do not include buffer 28.

Figure 4:
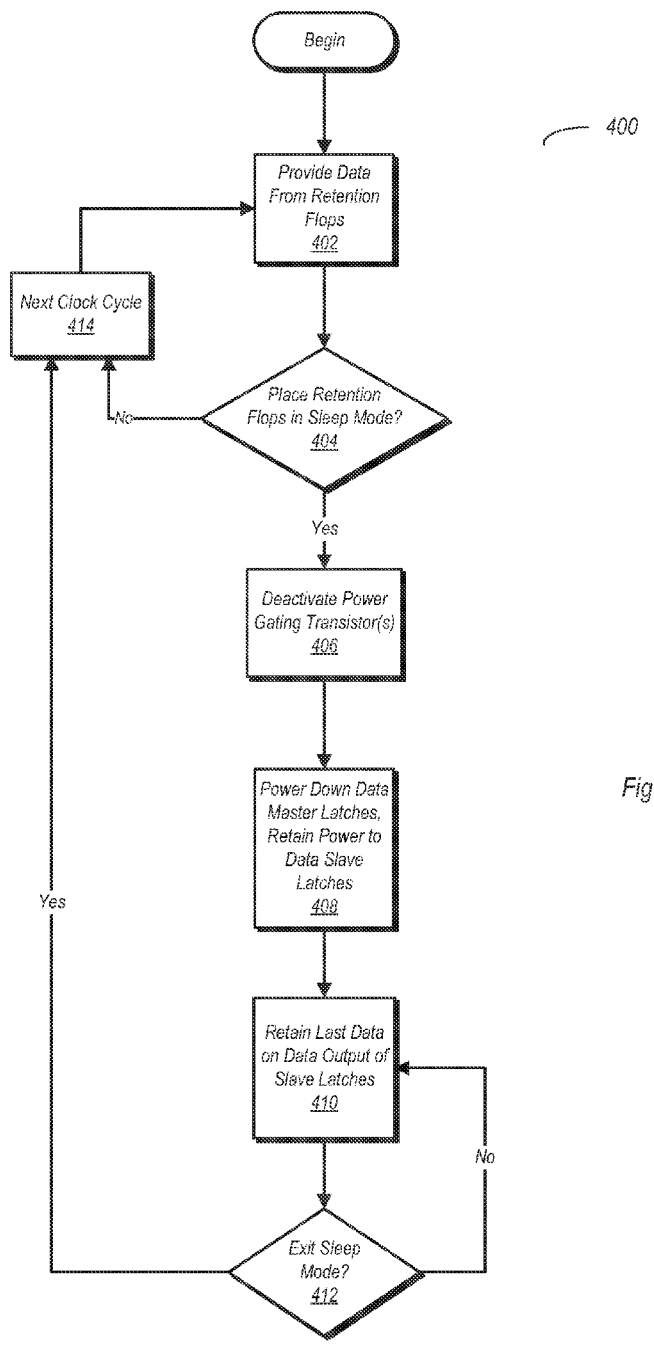
FIG. 4 is a flow diagram of one embodiment of a method for power gating a retention flop circuit.

Method Flow:

FIG. 4 is a flow diagram of one embodiment of a method for power gating a retention flop circuit. Method 400 begins with the providing of data from an output of one or more retention flops (block 402). Referring to either of FIGS. 2 and 3 above, the data may be provided on the Q output of second latch second latch 24. If no decision is made to place the retention flops into a sleep mode (block 404, no), then responsive to the next clock cycle (block 414), new data may be provided on the output of the retention flops (block 402), wherein this data may have the same state or the complementary state to the data provided in the previous clock cycle.

If a decision is made to place a retention flop into a sleep mode (block 404, yes), then one or more power-gating transistors may be deactivated (block 406). As shown in FIGS. 2 and 3, power-gating transistors may be coupled between a virtual voltage node and a corresponding global voltage node. For example, in FIG. 2, power-gating transistor 27 is coupled between the virtual Vss node and the global Vss node, which serves as a voltage return node (e.g., a ground node). When power-gating transistor 27 is deactivated, the virtual Vss node is effectively decoupled from the global Vss node, thus cutting off the return path for those circuit elements that are coupled to virtual Vss instead of being directly coupled to global Vss. A clock signal may also be disabled when entering the sleep mode by driving it to and holding it at a predetermined logic state (e.g., a logic low).

When a number of retention flops are placed into a sleep mode in accordance with method 400, each of their respective data master latches (e.g., first latch 22 of FIG. 2) may be powered down (block 408). The data slave latches (e.g., second latch 24 of FIG. 2) may remain powered on (block 408). Since the respective data slave latches of each retention flop remain powered on during the sleep mode, the last (i.e. most recent) data state may be retained on their respective outputs (block 410). Thus, each retention flop may retain its most recent data output state even while portions thereof are powered down for entry in the sleep mode.

If no decision is made to exit the sleep mode (block 412, no), then the most recent data output state may be retained by each of the retention flops (block 410). If a decision is made to exit the sleep mode (block 412, yes), then responsive to the next received clock cycle (block 414), data may be provided on the outputs of the retention flops responsive to newly received data (block 402).

Figure 5:
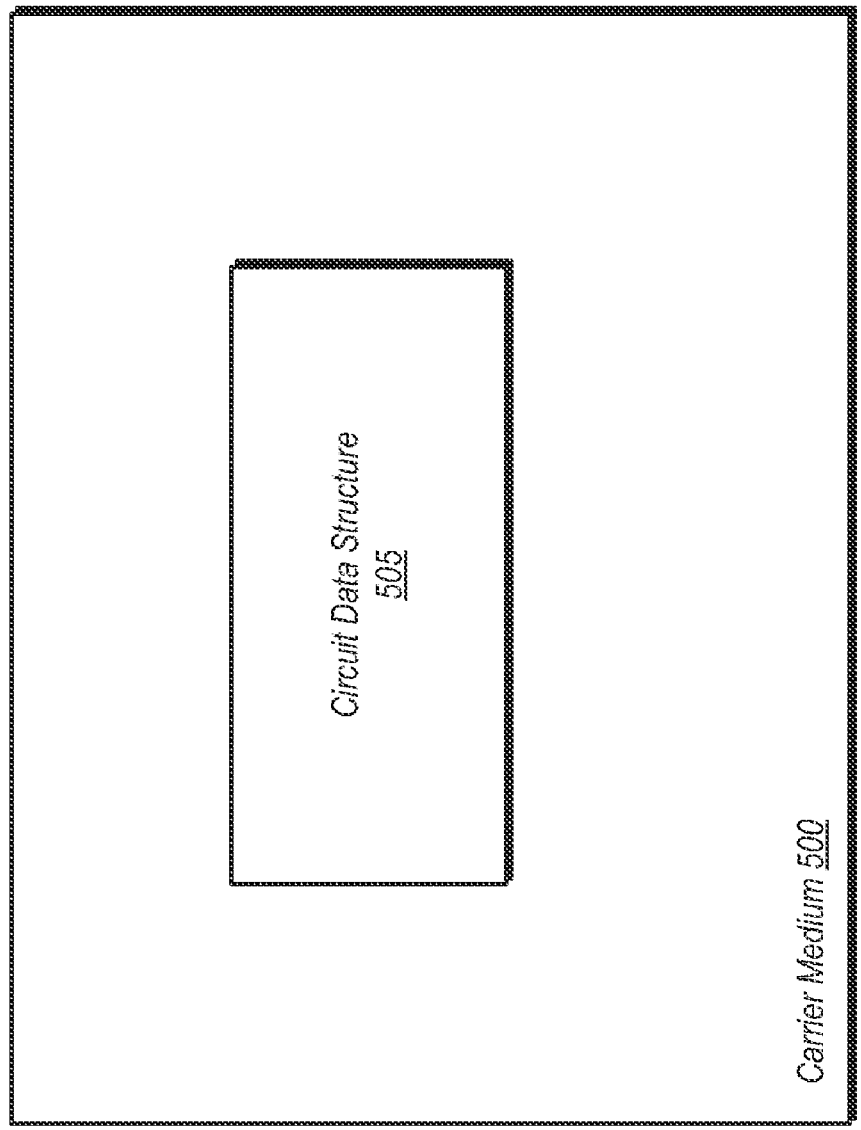
FIG. 5 is a block diagram of one embodiment of a carrier medium.

Computer Readable Medium:

Turning next to FIG. 5, a block diagram of a non-transitory computer accessible storage medium 500 including a data structure 505 representative of IC 10 (of FIG. 1) is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, circuit data structure 505 as carried on the computer accessible storage medium 500 may be a database or other type of data structure which can be read by a program and used, directly or indirectly, to fabricate the hardware of IC 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising IC 10. The netlist may then be placed and routed to produce a data set describing geometric shapes to be applied to masks. The masks may then be used in various semiconductor fabrication steps to produce a semiconductor circuit or circuits corresponding to IC 10. Alternatively, the database on the computer accessible storage medium 500 may be the netlist (with or without the synthesis library) or the data set, as desired.

While the computer accessible storage medium 500 carries a representation of and IC 10, other embodiments may carry a representation of any portion of IC 10, as desired, including any set of agents (e.g., flop 20, data master latch 22, etc.), or portions thereof.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
   a master latch of a master-slave flip-flop, wherein the master latch is coupled to a first global voltage node and a virtual voltage node, wherein the master latch is configured to receive a data input signal;
   a slave latch of the master-slave flip-flop, wherein the slave latch is coupled to receive the data input signal from the master latch, wherein the slave latch is coupled to the first global voltage node and a second global voltage node, and wherein the slave latch is configured to provide a data output signal based on at a state dependent on a state of the data input signal;
   a power-gating circuit coupled between the virtual voltage node and the second global voltage node, wherein the power-gating circuit is configured to, when active, couple the virtual voltage node to the second global voltage node, wherein the virtual voltage node and the second global voltage node are decoupled when the power-gating circuit is inactive; and
   a power control circuit is configured to place the master-slave flip-flop in a sleep mode by deactivating the power-gating circuit to power down the master latch and inhibiting a clock signal from being provided to each of the master and slave latches, and wherein the slave latch is configured to retain power when in the sleep mode.

2. The circuit as recited in claim 1, wherein the first global voltage node is a global voltage supply node, wherein the second global voltage node is a global voltage return node, and wherein the virtual voltage node is a virtual voltage return node, and wherein the power-gating circuit includes one or more transistors coupled between the virtual voltage return node and the global voltage return node.

3. The circuit as recited in claim 1, wherein the first global voltage node is a a global voltage return node, wherein the second global voltage node is a global voltage supply node, and wherein the virtual voltage node is a virtual voltage supply node, and wherein the power-gating circuit includes one or more transistors coupled between the virtual voltage supply node and the global voltage supply node.

4. The circuit as recited in claim 1, wherein the master-slave flip-flop is configured to enable scan testing, wherein the second latch circuit is configured to function as a scan master latch, wherein the second latch circuit is configured to receive a scan data bit.

5. The circuit as recited in claim 4, further comprising a latch configured to operate as a scan slave latch, wherein the scan slave latch is coupled to the first global voltage node and a virtual voltage node, wherein the scan slave latch is coupled to receive the scan data bit from the slave latch, and wherein the scan slave latch is configured to provide the scan data bit on a scan data output.

6. The circuit as recited in claim 4, wherein the slave latch includes a first output configured to convey the data output signal and a second output configured to convey the scan data signal, and wherein the slave latch is configured to provide the scan data bit to one of the first or second outputs.

7. The circuit as recited in claim 4, wherein the slave latch includes a first input coupled to receive the data input signal from the master latch and a second input configured to receive the scan data bit, wherein the slave latch is configured to convey the data input signal to one of the first or second outputs.

8. The circuit as recited in claim 1, wherein the circuit further comprises a buffer coupled to a first global voltage node and the virtual voltage node, wherein the buffer is coupled to receive the data output signal from the slave latch.

9. The circuit as recited in claim 1, wherein the clock signal, when active, includes a first clock edge and a second clock edge, wherein the master latch is configured to provide the data signal to the slave latch responsive to receiving the first clock edge, and wherein the slave latch is configured to provide the data output signal responsive to receiving the second clock edge.

10. An integrated circuit comprising:
a power control unit;
at least one power-gating circuit having a gate terminal coupled to receive a power control signal from the power control unit; and
a plurality of master-slave flip-flops, wherein each of the master-slave flip-flops includes:
a master latch coupled to a first global voltage node and a virtual voltage node, wherein the first latch is configured to receive a data input signal and a clock signal; and
a slave latch coupled to receive the data input signal from the master latch and further coupled to receive the clock signal, wherein the slave latch is coupled to the first global voltage node and a second global voltage node, and wherein the slave latch is configured to provide a data output signal at a state dependent on a state of the data input signal;
wherein the at least one power-gating circuit is coupled between the virtual voltage node and the second global supply node and is configured to couple the virtual voltage node to the second global voltage node responsive to assertion of the power control signal by the power control unit;
wherein the power control unit is configured to cause each of the plurality of master-slave flip-flops to enter a sleep mode by de-asserting the power control signal and further causing the clock signal to be inhibited.

11. The integrated circuit as recited in claim 10, wherein the power-gating circuit is further configured to decouple the virtual voltage node from the second global voltage node responsive to de-assertion of the power control signal by the power control unit.

12. The integrated circuit as recited in claim 10, wherein the power control unit is configured to provide a clock enable signal to a clock-gating circuit coupled to receive the clock signal, wherein the clock-gating circuit is configured to provide the clock to each of the plurality of master-slave flip-flops when the clock enable signal is asserted and further configured to inhibit the clock signal when the clock enable signal is de-asserted.

13. The integrated circuit as recited in claim 12, wherein the clock-gating circuit is configured to provide a predetermined logic value to a clock input of each of the plurality of master-slave flip-flops when the clock enable signal is de-asserted.

14. The integrated circuit as recited in claim 10, wherein the first global voltage node is a global voltage supply node, wherein the second global voltage node is a global voltage return node, and wherein the virtual voltage node is a virtual voltage return node.

15. The integrated circuit as recited in claim 10, wherein the first global voltage node is a global voltage return node, wherein the second global voltage node is a global voltage supply node, and wherein the virtual voltage node is a virtual voltage supply node.

16. The integrated circuit as recited in claim 10, wherein each of the plurality of master-slave flip-flops further includes a scan slave latch, wherein the slave latch is further configured to operate as a scan master latch.

17. The integrated circuit as recited in claim 10, wherein the circuit further comprises a buffer coupled to a first global voltage node and the virtual voltage node, wherein the buffer is coupled to receive the data output signal from the second latch circuit.

18. The integrated circuit as recited in claim 10, wherein the clock signal includes a first clock edge and a second clock edge, wherein the master latch is configured to provide the data signal to the slave latch responsive to receiving the first clock edge, and wherein the slave latch is configured to provide the data output signal responsive to receiving the second clock edge.

19. A method comprising:
providing a data signal to a data input of a first latch of a master-slave flip-flop including the first latch and a second latch, wherein the first and second latches are configured to act, respectively, as master and slave latches of a the master-slave flip-flop;
the second latch receiving the data signal from the first latch and providing the data signal on a data output;

entering a sleep mode, wherein entering a sleep mode comprises powering down the first latch subsequent to the second latch receiving the data signal from the first latch;

retaining power to the second latch subsequent to powering down the first latch, wherein the second latch is configured to retain a state of the data signal on the data output; and inhibiting a clock signal from being provided to both the first and second responsive to entering the sleep mode.

20. The method as recited in claim 19, further comprising: providing a clock signal to a clock input of each of the first and second latches when the first and second latches are receiving power.

21. The method as recited in claim 19, wherein the first latch is coupled to a first global voltage node and a virtual voltage node, wherein the second latch is coupled to the first global voltage node and a second global voltage node, and wherein the method further comprises:

activating a power-gating circuit coupled between the virtual voltage node and the second global voltage node in order to provide power to the first latch; and deactivating the power-gating circuit in order to power down the first latch, wherein deactivating the power-gating circuit comprises decoupling the virtual voltage node from the second global voltage node.

22. The method as recited in claim 21, wherein the first global voltage node is a global voltage supply node, wherein the second global voltage node is a global voltage return node, and wherein the virtual voltage node is a virtual voltage return node.

23. The method as recited in claim 21, wherein the first global voltage node is a global voltage return node, wherein the second global voltage node is a global voltage supply node, and wherein the virtual voltage node is a virtual voltage supply node.

24. A non-transitory computer readable medium comprising a data structure which is operated upon by a program executable on a computer system, the program operating on the data structure to perform a portion of a process to fabricate an integrated circuit including circuitry described by the data structure, the circuitry described in the data structure including:

a first latch circuit coupled to a first global voltage node and a virtual voltage node and configured to receive a data input signal;

a second latch circuit coupled to receive the data input signal from the first latch circuit, wherein the second latch circuit is coupled to the first global voltage node and a second global voltage node, and wherein the second latch circuit is configured to provide a data output signal at a state dependent on a state of the data input signal, wherein the first and second latch circuits are configured to operate as master and slave latches, respectively, of a master-slave flip-flop;

a power-gating circuit coupled between the virtual voltage node and the second global voltage node, wherein the power-gating circuit is configured to, when active, couple the virtual voltage node to the second global voltage node; and a power control circuit, wherein the power control circuit is configured to place the master-slave flip-flop in a sleep mode by deactivating the power-gating circuit and inhibiting a clock signal from being provided to each of the master and slave latches.

25. The computer readable medium as recited in claim 24, wherein the first global voltage node described in the data structure is a global voltage supply node, wherein the second global voltage node described in the data structure is a global voltage return node, and wherein the virtual voltage node described in the data structure is a virtual voltage return node.

26. The computer readable medium as recited in claim 24, wherein the first global voltage node described in the data structure is a global voltage return node, wherein the second global voltage node described in the data structure is a global voltage supply node, and wherein the virtual voltage node described in the data structure is a virtual voltage supply node.

27. The computer readable medium as recited in claim 24, wherein the data structure comprises one or more of the following types of data:
HDL (high-level design language) data;
RTL (register transfer level) data;
Graphic Data System (GDS) II data.

28. The circuit as recited in claim 1, and wherein the slave latch is configured to retain a value of the data output signal when the master-slave flip-flop is in the sleep mode.

29. The integrated circuit as recited in claim 10, wherein the slave latch of each of the master-slave flip-flops is configured to retain power when in the sleep mode, and wherein the slave latch of each of the master-slave flip-flops is configured to retain a state of a respective data output signal when in the sleep mode.

30. The computer readable medium as recited in claim 24, wherein the second latch described in the data structure is configured to retain a value of the data output signal when the master-slave flip-flop described in the data structure is in a sleep mode.

* * * * *